United States Patent [19]
Watt

[11] Patent Number: 5,825,600
[45] Date of Patent: Oct. 20, 1998

[54] FAST TURN-ON SILICON CONTROLLED RECTIFIER (SCR) FOR ELECTROSTATIC DISCHARGE (ESD) PROTECTION

[75] Inventor: Jeffrey Watt, Mountain View, Calif.

[73] Assignee: Cypress Semiconductor Corp., San Jose, Calif.

[21] Appl. No.: 845,302

[22] Filed: Apr. 25, 1997

[51] Int. Cl.$^6$ .................................................. H02H 3/22
[52] U.S. Cl. .............................. 361/56; 361/111; 257/356
[58] Field of Search ................................ 361/56, 91, 111; 257/356, 355, 360–363

[56] References Cited

U.S. PATENT DOCUMENTS

| | | |
|---|---|---|
| 4,990,802 | 2/1991 | Smooha . |
| 5,019,888 | 5/1991 | Scott et al. . |
| 5,043,782 | 8/1991 | Avery . |
| 5,140,401 | 8/1992 | Ker et al. . |
| 5,182,220 | 1/1993 | Ker et al. . |
| 5,218,222 | 6/1993 | Roberts . |
| 5,289,334 | 2/1994 | Ker et al. . |
| 5,329,143 | 7/1994 | Chan et al. . |
| 5,576,557 | 11/1996 | Ker et al. ................................ 257/173 |
| 5,591,992 | 1/1997 | Leach ...................................... 257/173 |
| 5,602,404 | 2/1997 | Chen et al. ............................. 257/112 |
| 5,625,522 | 4/1997 | Watt ........................................ 361/111 |
| 5,640,299 | 6/1997 | Leach ........................................ 361/56 |
| 5,670,799 | 9/1997 | Croft ....................................... 257/173 |
| 5,671,111 | 9/1997 | Chen ......................................... 361/56 |
| 5,675,469 | 10/1997 | Racino et al. .......................... 361/212 |
| 5,682,047 | 10/1997 | Consiglio et al. ...................... 257/335 |

OTHER PUBLICATIONS

"ESD Phenomena and Protection Issues in CMOS Output Buffers;" C. Duvvury, R.N. Rountree, Y. Fong, and R.A. McPhee; 1987; 174–180, no month.

"Internal Chip ESD Phenomena Beyond the Protection Circuit;" Charvake Duvvury, Robert N. Rountree, and Olen Adams; 1988; 2133–2138, no month.

"Improving the ESD Failure Threshold of Silicided nMOS Output Transistors By Ensuring Uniform Current Flow;" T. Polgreen and A. Chatterjee; 1989; 167–174, no month.

"Achieving Uniform nMOS Device Power Distribution for Sub-micron ESD Reliability;" Charvaka Duvvuy, Carlos Diaz, and Tim Haddock; 1992; 92–131 through 92–134, no month.

"ESD Protection in a Mixed Voltage Interface and Multi-Rail Disconnected Power Grid Environment in 0.50– and 0.25–$\mu$m Channel Length CMOS Technologies;" Steven H. voldman, 94–125 through 94–134, no date.

(List continued on next page.)

*Primary Examiner*—Jeffrey A. Gaffin
*Assistant Examiner*—Michael J. Sherry
*Attorney, Agent, or Firm*—Maiorana & Acosta, P.C.

[57] ABSTRACT

An apparatus for protecting an integrated circuit against damage from electrostatic discharge (ESD) includes an ESD bus that is connected to multiple input pads through a respective diode. The ESD bus—the node to be protected—is coupled to the negative power supply bus ($V_{ss}$) by a FET-triggered SCR circuit. In particular, the SCR circuit includes, equivalently, a PNP bipolar transistor, and an NPN bipolar transistor interconnected so that each transistor receives base current from the collector terminal of the other. A field effect transistor (FET) is configured to trigger the SCR into conduction, to thereby provide a low-impedance path to safely shunt ESD charge. The drain terminal of the FET is connected to an intermediate node of a resistance between the ESD bus, and the PNP emitter terminal. ESD charge on an input pad of the integrated circuit forward biases the respective diodes, and charges the ESD bus. When the voltage on the ESD bus reaches a predetermined threshold voltage, the FET drain region breaks down, and triggers the SCR circuit into conduction to shunt the charge on the ESD bus to $V_{ss}$. The voltage drop occasioned by current flowing from the ESD bus to the intermediate node at the onset of the FET drain breakdown hastens the turn-on of the SCR, thus improving the response time for handling fast ESD events, such as those in accordance with the Charged Device Model (CDM).

21 Claims, 3 Drawing Sheets

OTHER PUBLICATIONS

"Core Clamps for Low Voltage Technologies;" S. Dabral, R. Aslett and T. Maloney; 94–141 through 94–149, no date.

"Mixed–Voltage Interface ESD Protection Circuits for Advance Microprocessors in Shallow Trench and LOCOS Isolation CMOS Technologies;" Steven H. voldman and Giafranco Gerosa; 1994; 994–277 through 92–280, no month.

"Electrostatic Discharge Protection ina 4–MBIT Dram;" Mark D. Jaffe and Peter E. Cottrell; 1–6, no date.

"Proximity Effects of 'Unused' Output Buffers on ESD Performance;" J.P. LeBlanc and M.D. Chaine; 327–330, no date.

"Sub–Micron Chip ESD Protection Schemes which Avoid Avalanching Junction;" E.R. Worley, R. Gupta, B. Jones, R. Kjar, C. Nguyen, and M. Tennyson; 95–13 through 95–20, no date.

"A Low–Voltage Triggering SCR for On–Chip ESD Protection at Output and Input Pads;" Amitava Chatterjee and Thomas Polgreen; 1991; 21–22, no month.

FAST TURN-ON SILICON CONTROLLED RECTIFIER (SCR) FOR ELECTROSTATIC DISCHARGE (ESD) PROTECTION

BACKGROUND OF THE INVENTION

1. Field of the Invention

The present invention relates generally to protection devices, and, more particularly, to protection devices for protecting integrated circuits from various electrical transients, including electrostatic discharge (ESD).

2. Description of the Related Art

As very large scale integration (VLSI) circuit geometries continue to shrink, the corresponding gate oxide thicknesses have also continued to decrease. This decrease in thickness, relative to breakdown voltage, has resulted in an increased susceptibility to damage from the application of excessive voltages. For example, an electrostatic discharge (ESD) event is capable of developing such an excess voltage. During an ESD event, charge is transferred between one or more pins of the device (i.e., integrated circuit) and another conducting object in a time period that is typically less than one microsecond. This charge transfer can develop voltages that are large enough to break down insulating films (e.g., gate oxides) on the device, or can dissipate sufficient energy to cause electrothermal failures in the device. Such failures include contact spiking, silicon melting, or metal interconnect melting.

Accordingly, many attempts have been made in the prior art to protect semiconductor devices from such ESD events. The resulting protection circuits may typically be connected to all Input/Output (I/O) pads of an integrated circuit (IC) to safely dissipate the energy associated with ESD events without causing any damage to the circuitry internal to the device. Protection circuits have also been connected to power supply pads, or between power supply buses to prevent such damage to internal circuits.

In developing effective ESD protection circuitry, circuit designers may be limited with regard to the particular structures used, inasmuch as the protection circuit so designed must integrate well with the remainder of the integrated circuit. That is, the protection circuit must not interfere with meeting chip-level parameters. One such parameter of interest is known as an input "leakage" current parameter. This parameter is particularly important where the input pins of the integrated circuit are subjected (either by design or accidentally) to voltages which exceed the positive power supply voltage of the integrated circuit. For example, particular integrated circuits may be contemplated for use in a mixed-voltage environment, where the integrated circuit may operate at one voltage level (e.g., $V_{DD}$= 3.3 volts), but must interface with another integrated circuit operating at a different, higher power supply voltage (e.g. 5.0 volts). As another example, the particular integrated circuit may be required to have a "hot-socket insertion" capability (i.e., the destination system is not powered down prior to insertion of the integrated circuit). In these "hot-socket" insertion situations, the time order of voltages applied to the various pins of the IC cannot be controlled.

One approach in providing ESD protection circuitry has been to employ either a grounded-gate FET, or a parasitic field FET. However, these structures have been found to be less than satisfactory in safely shunting damaging charge accumulation away from the affected node when used in a salicided process.

Another approach taken in the art has been to use a silicon controlled rectifier (SCR) type structure for transferring charge away from an affected node. While there has been some progress in the development of SCR-based structures in meeting state-of-the-art standards for protection against ESD events, such as the standards described by the well-known Human Body Model (HBM), fast ESD events, such as those described by the Charged Device Model (CDM), have uncovered weaknesses in at least some of the known SCR-based ESD protection structures.

Accordingly, there is a need to provide an improved ESD protection circuit suitable for use in an integrated circuit that minimizes or eliminates one or more of the problems as set forth above.

SUMMARY OF THE INVENTION

It is an object of the present invention to provide protection against excessive charge accumulation, such as that arising from electrostatic discharge (ESD) on interface pins of an integrated circuit. It is a further object of the present invention to provide a protection circuit and structure that provides improved ESD protection against an ESD event that occurs in accordance with the Charged Device Model (CDM), especially in integrated circuits fabricated according to processes which use salicide (i.e., Self-Aligned siLICIDE).

To achieve these and other objects, and in accordance with the present invention, an apparatus for protecting a semiconductor device from excessive charge is provided, and which includes protection means for isolating a first node of the device from a second node of the device when in a first state. In a preferred embodiment, the first state corresponds to a normal mode of operation and the first node is the node to be protected. The protection means is further configured for transferring charge from the first node to the second node when in a second state. In the preferred embodiment, the second state corresponds to an occurrence of an ESD event. The protection means preferably includes a silicon controlled rectifier (SCR) circuit, a field effect transistor (FET) configured to trigger the SCR into conduction, and a resistive voltage divider. The SCR circuit is arranged to perform the above-mentioned function of transferring charge from the first node to the second node. The voltage divider includes a pair of resistive elements and is connected between the first node and the SCR circuit. The drain of the FET is connected to a common node in the voltage divider, and is configured to place the SCR circuit in a low impedance state (corresponding to the second state) when the voltage on the first node (i.e., protected node) reaches a predetermined threshold level. In particular, the drain junction breaks down, which begins the SCR latch up process. The low impedance presented by the SCR when latched-up permits charge to be shunted safely away from the first node. Once current through the SCR is interrupted (e.g., when the ESD-originated charge has been sufficiently shunted away), the SCR transitions to a high-impedance state, which substantially minimizes undesirable input leakage currents.

One advantage of a preferred embodiment according to the present invention is that the SCR circuit, the structure which safely shunts dangerous charge accumulations from the protected node, is turned on quickly enough to handle fast ESD events (such as CDM) by virtue of the FET drain connection to the common node of the resistive voltage divider. In particular, the resistive divider is formed of material in an n-well, parts of which also form part of the SCR circuit. When the FET drain breakdown occurs, current through the n-well (i.e., through part of the resistive voltage divider), causes a voltage drop across the n-well, which forward biases a p$^+$ diffusion region in the n-well (which defines an emitter terminal of a PNP transistor of the SCR circuit). The forward biased emitter terminal causes the SCR circuit to begin to turn on. This turn-on mechanism provides improved ESD protection performance, especially for fast ESD events (such as CDM events). For example, one constructed embodiment according to the invention passed 8800 V HBM, while another constructed embodiment passed 1000 V CDM.

Other objects, features, and advantages of the present invention will become apparent to one skilled in the art from the following detailed description and accompanying drawings illustrating features of this invention by way of example, but not by way of limitation.

DETAILED DESCRIPTION OF THE PREFERRED EMBODIMENTS

Figure 1:
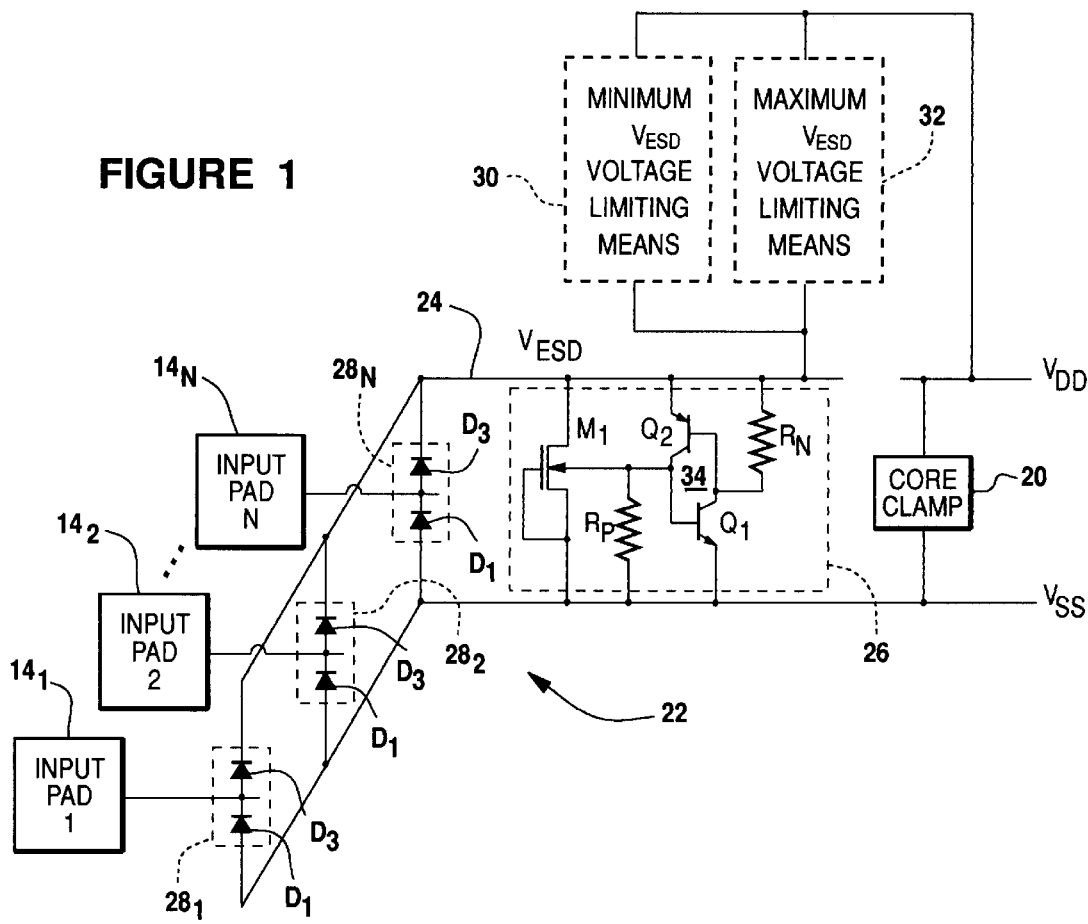
FIG. 1 is a simplified equivalent circuit schematic and block diagram view of one embodiment of the invention.

Referring now to the drawings wherein like reference numerals are used to identify identical components in the various views, FIG. 1 shows an apparatus 22 for protecting a semiconductor device from electrostatic discharge (ESD) events. Apparatus 22 is adapted for use in connection with a plurality of input pads, such as input pads $14_1, 14_2, \ldots 14_N$. It should be understood that each of the input pads $14_1, 14_2, \ldots 14_N$ are still connected to a secondary ESD protection circuit (not shown), and, further still connected to an input buffer (not shown). The positive power supply bus for the integrated circuit, designated $V_{DD}$, is protected against ESD with respect to the negative power supply bus of the integrated circuit, $V_{ss}$, and vice-versa, using a core clamp 20. Core clamp 20 is conventional in the art and will not be further addressed.

Apparatus 22 includes an electrostatic discharge (ESD) bus 24, designated $V_{ESD}$, an ESD protection circuit, such as FET-triggered silicon controlled rectifier (SCR) circuit 26, a plurality of diode clamping circuits 28, such as circuits $28_1, 28_2, \ldots 28_N$, means, such as circuit 30, for limiting a voltage potential of bus 24 to a predetermined minimum level, and means, such as circuit 32, for limiting the voltage potential of bus 24 to a predetermined maximum level.

A first plurality of diodes $D_1$ are coupled between the negative power supply bus $V_{ss}$ and a respective one of the plurality of input pads $14_1, 14_2, \ldots 14_N$. As shown in FIG. 1, the orientation of the plurality of diodes $D_1$ (i.e., anode connected to $V_{ss}$, and cathode connected to the input pad) is such that a negative polarity ESD event is clamped to within one diode drop of $V_{ss}$. Further, each input pad $14_1, 14_2, \ldots 14_N$ is connected to the $V_{ESD}$ bus 24 by a respective one of a second plurality of diodes $D_3$. Diodes $D_3$ are provided for shunting charge from positive polarity ESD events on a respective one of the input pads $14_1, 14_2, \ldots 14_N$ to the $V_{ESD}$ bus 24.

In one embodiment of the present invention, particularly one that does not include circuits 30, and 32 the $V_{ESD}$ bus 24 is isolated from the positive power supply bus $V_{DD}$. The $V_{ESD}$ bus 24 may be formed in a semiconductor device using a variety of conductive materials; however, in a preferred embodiment, metal is used to form the $V_{ESD}$ bus 24.

Protection circuit 26 is connected between the $V_{ESD}$ bus 24 and the negative power supply bus $V_{ss}$ of the device to be protected and is provided for isolating the $V_{ESD}$ bus 24 from the negative power supply $V_{ss}$ when in a first, high-impedance, "OFF" state to thereby reduce externally-sourced leakage currents into input pads $14_1, 14_2, \ldots 14_N$ (i.e., as through a respective diode $D_3$, to $V_{ESD}$ bus 24, and to ground or $V_{DD}$). Circuit 26 is further provided for transferring charge from the $V_{ESD}$ bus 24 to the negative power supply bus $V_{ss}$ when in a second, low-impedance "ON" state. Circuit 26 further includes means for transitioning from the first state to the second state when a voltage potential of the $V_{ESD}$ bus 24 reaches a predetermined threshold level. Through the above-described functionality, the protection circuit 26 provides for the elimination, or at least a substantial reduction in, leakage current during normal operation, with maintaining the capability of shunting destructively large ESD charges to ground when a predetermined threshold level appears on the $V_{ESD}$ bus 24 (i.e., from input pad via diode $D_3$). In particular, the predetermined threshold level is selected to be higher than the voltage level of the positive power supply bus ($V_{DD}$), and, further, selected to be higher than the highest normal operating voltage expected to be encountered at the input pads.

Thus, although any structure meeting the above-identified functional specifications is within the spirit and scope of the present invention, in the embodiment shown in FIG. 1, the ESD protection circuit is a FET-triggered silicon controlled rectifier (SCR) circuit 26, which includes an SCR circuit 34 and a field effect transistor $M_1$ for controlling the SCR circuit 34. In particular, SCR circuit 34 is represented in FIG. 1 by an equivalent electrical circuit diagram including an NPN bipolar junction transistor $Q_1$, and PNP bipolar junction transistor $Q_2$ that are interconnected so that each receives base current from the collector terminal of the other. When either transistor is turned-on, it supplies base current to the other. Thus, SCR circuit 34 latches up with both transistors turned-on after either of the transistors is initially turned-on. The two transistors turn-off when the current is interrupted in either transistor.

A more complete understanding of FET-triggered SCR circuit 26 as employed in a first embodiment, may be had from a discussion of the semiconductor structure used for its implementation. Accordingly, reference is now made to FIG. 2, which shows a semiconductor structure corresponding to the FET-triggered SCR circuit 26, in cross-sectional, simplified, and exaggerated form for purposes of illustration.

The semiconductor structure corresponding to circuit 26 includes a substrate of a first conductivity type, such as P-type silicon substrate 36, a first ohmic contact of the first conductivity type, such as P⁺ diffusion 38 formed in substrate 36, a drain region of a second conductivity type opposite the first conductivity, such as N⁺ diffusion region 40 formed in substrate 36, a source region of the second conductivity type, such as N⁺ diffusion region 42 formed in the substrate, a channel region 44 defined in the substrate between spaced apart drain 40 and source 42 regions, a well region of the second conductivity type, such as N-well 46 formed in substrate 36, a second ohmic contact region of the second conductivity type, such as N⁺ diffusion region 48 formed in N-well 46, a junction region of the first conductivity type, such as P⁺ diffusion region 50 formed in well 46, a layer of dielectric material 52 disposed over substrate 36, and a control gate 54 formed over layer 52.

Layer 52 includes a gate dielectric region overlying channel 44. Control gate 54 includes a portion overlying channel 44. First ohmic contact 38, control gate 54, and source region 52 are connected to the negative power supply bus $V_{ss}$. The $V_{ESD}$ bus 24 is connected to drain region 40, junction region 50, and second ohmic contact region 48.

Figure 2:
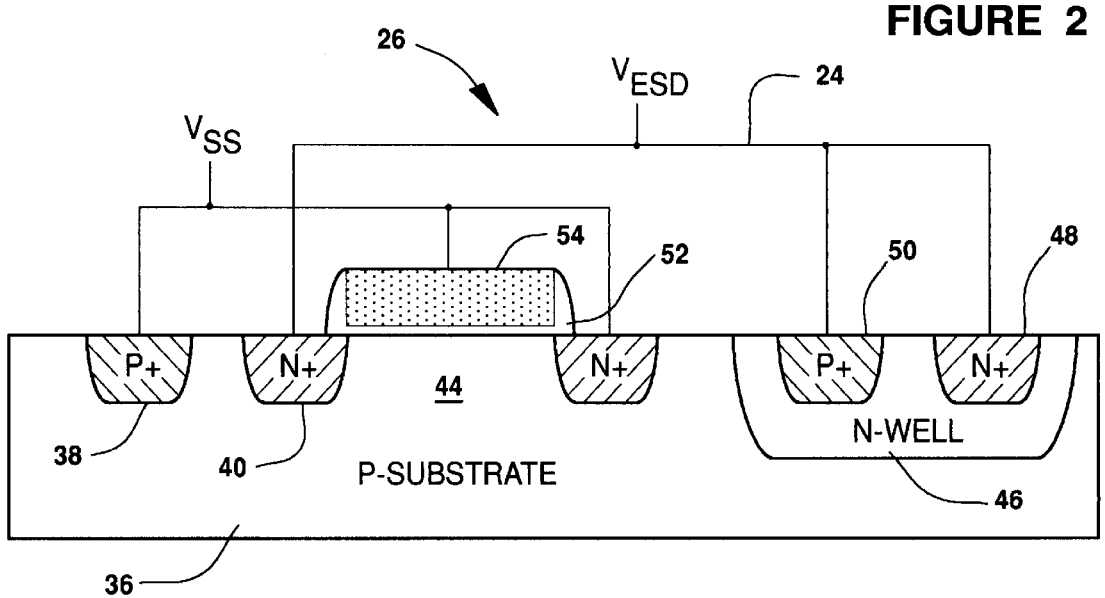
FIG. 2 is a simplified, exaggerated cross-sectional view of a semiconductor structure corresponding to the protection circuit in FIG. 1.

It should be appreciated that the structure shown in FIG. 2 is diagrammatic and exaggerated for ease of illustration. It should further be appreciated that the variations in donor/acceptor impurities, and concentrations of same to fabricate the structure shown in FIG. 2 are many in number and are within the reach of one of ordinary skill in the art. However, in a constructed embodiment, the structure shown in FIG. 2 is particularly used in connection with a static RAM (SRAM) device having an operating voltage of $V_{DD}$=3.3V, and that must withstand applications of 5.0V (nominal) on certain input pads with low leakage current.

The P-type conductivity substrate 36 is typically relatively lightly doped (about $2.5 \times 10^{14}$ cm⁻³) and has a relatively low degree of conductivity. The P⁺ regions 38 and 50 are relatively heavily doped (about $1.0 \times 10^{20}$ cm⁻³) and of relatively high conductivity. The N⁺ conductivity type region (i.e., drain region 40/source region 42/region 48) are relatively heavily doped, typically about $1.5 \times 10^{20}$ cm⁻³, and have relatively high conductivity. The N-well 46 is relatively lightly doped, typically about $2.0 \times 10^{17}$ cm⁻³, and has a relatively low degree of conductivity. Dielectric material 52 may be silicon dioxide material, wherein the gate dielectric region overlying channel 44 may have a thickness in the range of 135–155 Å, and is preferably about 145 Å thick. Control gate 54 may comprise polycrystalline silicon ("poly") material having a thickness in the range of 2250–2750 Å, and is preferably about 2500 Å thick.

Referring to FIGS. 1, and 2, FET $M_1$ is formed by way of drain region 40, channel 44, source region 42, gate oxide 52, and control gate 54. NPN bipolar transistor $Q_1$ is formed by source region 42 (emitter), P-substrate 36 (base), and N-well 46 (collector). PNP bipolar transistor $Q_2$ is formed by P⁺ diffusion 50 (emitter), N-well 46 (base), and P-substrate 36 (collector).

With continued reference to FIGS. 1 and 2, a description of the operation of apparatus 22 will now be set forth in detail.

When a device employing the present invention is powered-up, the $V_{ESD}$ bus 24 is essentially at 0V. Protection circuit 26, particularly SCR circuit 34, is initially in a first, high-impedance "OFF" state. In this first state, voltages applied to input pads $14_1, 14_2, \ldots 14_N$, that are in excess of $V_{DD}$ will not cause large leakage currents to be drawn, but rather, will at most cause transient currents to flow through diode $D_3$ to charge $V_{ESD}$ bus 24 to a voltage level one diode drop below the excessive voltage level being applied (see below for disclosure of further embodiments that particularly address the transient current phenomena). Subsequent applications of voltages higher than $V_{DD}$ (e.g., 5.0V when $V_{DD}$=3.3V), will incur substantially no leakage currents. Controlled application of voltages, even in excess of $V_{DD}$, to input pins of a device in this context would be considered "normal" operation. However, ESD events are not considered part of "normal" operation.

For a negative polarity ESD event (hereinafter "ZAP") diodes $D_1$ forward bias and shunt the charge between the input pad subject to the ESD ZAP (i.e., one or more of input pads $14_1, 14_2, \ldots 14_N$) and the $V_{ss}$ bus. Moreover, ESD charge may be transferred from the $V_{ss}$ bus to the $V_{DD}$ bus, through core clamp 20, if the ESD ZAP is referenced to the $V_{DD}$ bus. Generally, the operation of the embodiment in accordance with the present invention, for a negative ESD ZAP, is identical to conventional methods.

For a positive ESD ZAP on one or more of the input pads $14_1, 14_2, \ldots 14_N$, respective diodes $D_3$ become forward biased and shunt the charge from the corresponding input pad $14_1, 14_2, \ldots 14_N$, to the $V_{ESD}$ bus 24. As charge is transferred onto $V_{ESD}$ bus 24, a voltage potential associated with bus 24 increases, with respect to $V_{ss}$, until the junction formed by the N⁺ drain region 40, and the P-substrate 36 (i.e., an np junction) breaks down under high reverse bias voltage. In the first embodiment, based on the fabrication details discussed above, this threshold occurs when about 12.3V is applied across the N⁺ junction and the P-substrate 36.

This breakdown condition injects holes into substrate 36, and causes FET $M_1$ to snapback. In the snapback mode, FET $M_1$ operates as a lateral NPN bipolar transistor, with base current being supplied by holes generated by impact ionization at the drain end (i.e., region 40) of channel 44. Once FET $M_1$ snaps back, the voltage between the N⁺ drain junction 40, and the N⁺ source 42 is reduced to about 9.0V, again, based on the foregoing fabrication details.

The holes that are generated by FET $M_1$ in snapback cause a corresponding voltage drop across P-substrate resistance $R_p$, which turns on NPN bipolar transistor $Q_1$. When transistor $Q_1$ turns on, current flows through N-well resistance $R_N$. The voltage drop which is thereby created across the equivalent resistance $R_N$ turns on PNP bipolar transistor $Q_2$. When transistor $Q_2$ turns on, it supplies base current to transistor $Q_1$, thus creating a feedback loop.

As a result of this current feedback, the SCR circuit 34 formed by transistors $Q_1$ and $Q_2$, "latches up" into a low-impedance "ON" state. In effect, then, FET $M_1$ is responsive to the voltage on the $V_{ESD}$ bus 24 to place SCR circuit 34 in the low-impedance state when the threshold voltage 12.3V is reached or, in other words, FET $M_1$ provides the means for transitioning to the low-impedance state.

This low-impedance state is characterized by a voltage drop of about 1.4V between the $V_{ESD}$ bus 24, and the negative power supply bus $V_{ss}$. The SCR circuit 34 will remain in the low-impedance state until current is interrupted; i.e., until all of the charge from the ESD ZAP is transferred from $V_{ESD}$ bus 24 to the $V_{ss}$, bus. Once the charge transfer is complete, the FET-triggered SCR circuit 26, particularly SCR 34, returns to a high-impedance "OFF" state. Positive ESD ZAP's, referenced to the positive power supply bus $V_{DD}$ can be transferred from the $V_{ss}$ bus to the $V_{DD}$ bus through core clamp 20.

In view of the foregoing, it should be appreciated that without regard to the voltage of the positive power supply bus $V_{DD}$, the voltage on the input pad can go as high as the FET $M_1$ $N^+$ drain junction breakdown voltage, plus one diode drop (i.e., for $D_3$), with very small leakage current. Based on the foregoing fabrication details for the constructed embodiment, a maximum allowed voltage on the input pad would be 13.0V. At this threshold level, the above-described breakdown occurs, thus triggering the SCR circuit 34. Of course, ESD events will likely be higher than this level, thus triggering circuit 26 into the low-impedance protection state. However, for a variety of applications, other than ESD events, where input voltages on the input pad exceed the positive power supply operating voltage $V_{DD}$, very low leakage levels can be obtained.

The foregoing describes one embodiment of the present invention. However, further embodiments of the present invention will now be set forth embodying improvements upon the basic invention, and are directed, generally, to controlling the voltage on the $V_{ESD}$ bus 24 during normal operation. As shown in FIG. 1, another embodiment includes circuit 30 for limiting or ensuring that the voltage of the $V_{ESD}$ bus 24 is maintained at a predetermined minimum level. Still another embodiment includes circuit 32 for limiting the voltage on the $V_{ESD}$ bus 24 to a maximum predetermined level. Yet another embodiment includes both circuits 30, and 32.

Figure 3A:
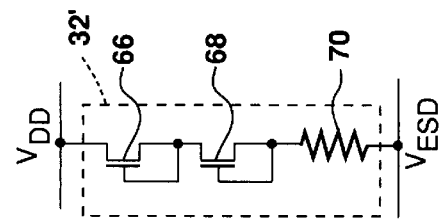
FIGS. 3A–3C show alternate minimum voltage level limiting structures that may be used in connection with the embodiment shown in FIG. 1.
Figures 3B, 3C, 4:
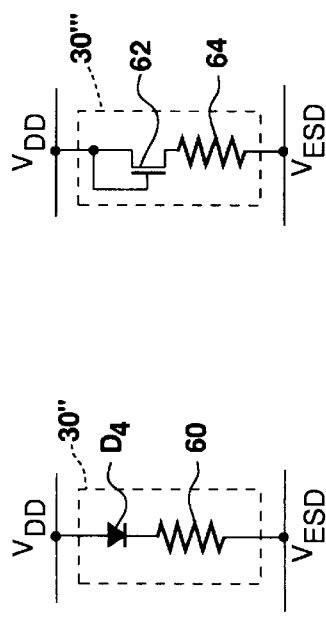
FIG. 4 shows a maximum voltage level limiting structure that may be used in connection with the embodiment shown in FIG. 1.

Referring now to FIGS. 3A–3C, three structures are illustrated for implementing circuit 30: 30', 30", and 30'". As background, in the first embodiment described above, the $V_{ESD}$ bus 24 is essentially floating when the input pad voltages are at or below the voltage potential of the $V_{ESD}$ bus; accordingly, leakage currents between the $V_{ESD}$ bus 24, and the power supply buses $V_{DD}$, $V_{ss}$, or input pads $14_1$, $14_2$, . . . $14_N$, should be very small. However, when the integrated circuit is powered up, the voltage on $V_{ESD}$ bus 24 should be close to 0V. When any of the input pads $14_1$, $14_2$, . . . $14_N$, rises above the voltage of $V_{ESD}$ bus 24 by about 0.7V (i.e., a forward-biased diode voltage drop of diode $D_3$), diode $D_3$ between a respective input pad $14_1$, $14_2$, . . . $14_N$, and $V_{ESD}$ bus 24 will forward bias, and cause current to flow from the input pad to $V_{ESD}$ bus 24. This current will charge up the $V_{ESD}$ bus, and, when the voltage on the $V_{ESD}$ bus 24 rises to about 0.7V below the input pad voltage, diode $D_3$ will turn-off, and current flow will be discontinued.

This transient current is equivalent to having an additional transient input capacitance whenever the input pad voltage rises more than about 0.7V above the voltage of the $V_{ESD}$ bus 24. Furthermore, since diode $D_3$ contains a parasitic PNP bipolar transistor, the capacitance of $V_{ESD}$ bus 24 is amplified, and appears as an input capacitance on any one of the input pads $14_1$, $14_2$, . . . $14_N$, whose voltage rises high enough to forward bias the respective diode $D_3$ to the $V_{ESD}$ bus 24. It should be appreciated that the transient capacitance persists only for the duration of the transient current.

The additional input capacitance can be reduced, or even substantially eliminated by limiting the minimum voltage on the $V_{ESD}$ bus 24 using one of the structures 30', 30", and 30'". Stated another way, by ensuring that the voltage of the $V_{ESD}$ bus 24 is always at least a certain value, transient currents, and thus input capacitance, can be eliminated.

Referring particularly to FIG. 3A, structure 30' includes a charge pump structure 56, and a resistor 58. Charge pump 56 is conventional in the art, and may be used to set the voltage of $V_{ESD}$ bus 24 to a level high enough such that diode $D_3$ connected between one of the input pads 14 to the $V_{ESD}$ bus 24 will never forward bias in normal operation, even under worst case conditions. In particular, charge pump 56 permits setting the voltage of $V_{ESD}$ bus 24 higher than the positive power supply voltage $V_{DD}$. For example, $V_{DD}$ may be 3.3V, but an input voltage $V_{inmax}$ may be 5.0V (nominal). Using structure 30', the voltage of bus $V_{ESD}$ bus 24 may be set to, for example, 5.5V. This configuration would ensure that none of the diodes $D_3$ would be forward biased under normal operating conditions. However, charge pump 56 consumes power, which may be unacceptable for low standby current-type products. Resistor 58 may be included to prevent ESD damage to charge pump 56.

Referring particularly to FIG. 3B, structure 30" includes diode $D_4$, connected in series with resistive element 60. Structure 30" maintains the voltage on the $V_{ESD}$ bus 24 at a level no more than a forward-biased diode voltage drop below the voltage on the positive power supply bus $V_{DD}$. In effect, structure 30" provides a clamping configuration that ensures that no additional input capacitance is seen at an input pad $14_i$ as long the input voltage on the input pad does not exceed $V_{DD}$. Again, resistor 60 is provided to protect against ESD events.

Referring particularly to FIG. 3C, structure 30'" includes an NMOS transistor 62, connected as a diode, in series with a resistive element 64. Structure 30'" is similar to structure 30", insofar as it maintains the voltage of $V_{ESD}$ bus 24 at a level no more than one threshold voltage $V_T$ below $V_{DD}$. The threshold voltage $V_T$ is generally a higher value than the voltage drop across diode $D_4$. Resistor 64 is used for protection against ESD events. In a constructed embodiment, structure 30" is used as a means for limiting the voltage of $V_{ESD}$ bus 24 to a predetermined minimum level during normal operation to thereby reduce the effective input capacitance at the input pads $14_1$, $14_2$, . . . $14_N$.

In yet another embodiment, the maximum voltage of the $V_{ESD}$ bus is limited to a predetermined maximum level during normal operation by inclusion of circuit 32 to prevent undesired triggering of SCR circuit 34. In particular, as mentioned above, since $V_{ESD}$ bus 24 is essentially floating, it is possible that it could be pumped up to a fairly high voltage during normal operation, for example, by noise on the input pins. Whenever an input pin voltage rises more than about 0.7V above $V_{ESD}$, diode $D_3$ will forward bias and transfer charge to $V_{ESD}$ bus 24. The voltage on the $V_{ESD}$ bus 24 will rise until diode $D_3$ turns off. Alternately, the voltage on $V_{ESD}$ bus 24 can also be increased by capacitive coupling between input pads $14_1$, $14_2$, . . . $14_N$ and $V_{ESD}$ bus 24 through a respective diode $D_3$. If the voltage on bus 24 becomes too large, FET $M_1$ may trigger SCR circuit 34, during normal operation, and cause either a non-destructive functional failure (i.e., bring down the voltage on a pin to such a level that a logic operation is incorrectly carried out), or, a permanent destructive failure (i.e., if a low-impedance source, such as a DC power supply, is coupled to an input then high currents may damage the device).

FIG. 4 illustrates structure 32' for implementing circuit 32 shown in FIG. 2. Structure 32' includes a pair of diode-connected NMOS transistors 66, 68 connected in series, with a resistive element 70, between $V_{DD}$ and $V_{ESD}$ such that the voltage on the $V_{ESD}$ bus 24 can only rise above the voltage of the positive power supply bus $V_{DD}$ by the sum of the threshold voltages of the series-connected NMOS FETs 66, and 68. Once this threshold level (i.e., $2*V_T$) is passed, the FETs 66, and 68 will turn-on, and thereby limit the voltage on the $V_{ESD}$ bus 24. It should be appreciated that NMOS FETs 66, and 68 have a source-to-substrate voltage that will increase their threshold voltage. The number of series-connected FETs may be selected to allow the input pads to rise as high as desired without turning on the FETs, and thereby causing input leakage currents. In the constructed embodiment, two NMOS FETs, 66, and 68, were selected to allow input pad voltages to be 5.5V, when $V_{DD}$ is 3.0V, under worst case temperature conditions of 155° C., and still meet input leakage requirements. Resistor 70, of course, may be included to prevent ESD damage to FETs 66, and 68.

It should be appreciated that structures 30', 30", 30''', and 32' have been designed for low current during ESD events—the SCR circuit 34 designed to shunt most of the ESD charge. The low current can be obtained by inserting a series resistance (as illustrated), or by design of the components.

An apparatus for protecting a semiconductor device, in accordance with the present invention, permits effective dissipation of ESD events under a variety of fabrication processes, while providing for extremely low input leakage currents for input voltages that are above the operating voltage of the chip, but are within the normal voltages of a mixed-voltage environment (e.g., $V_{DD}$=3.3V while input voltages equal 5.0V). Alternate embodiments that include structures for limiting minimum and maximum voltages on an ESD bus have extremely low input pin capacitance values, and are extremely stable (i.e., no undesired triggering of the ESD protection circuit—SCR circuit).

Figure 5:
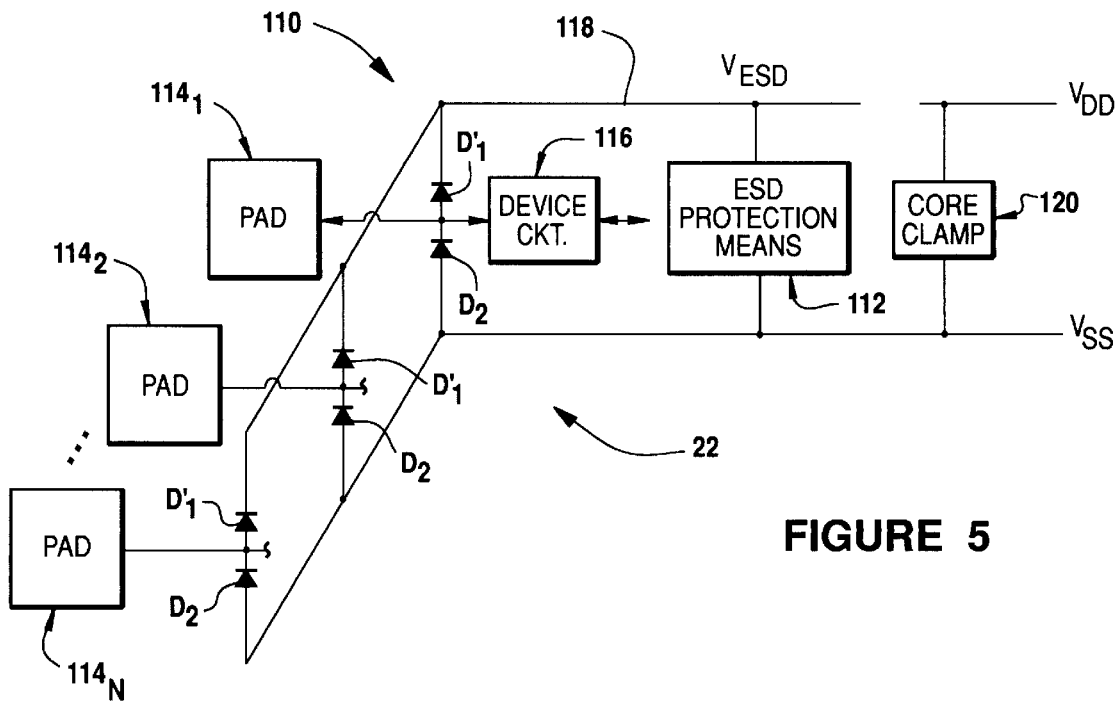
FIG. 5 is a simplified, equivalent circuit schematic and block diagram view of one environment in which a preferred embodiment according to the present invention may be employed.

FIG. 5 shows a semiconductor device 110 which includes a preferred embodiment according to the present invention, namely, apparatus 112. Apparatus 112 provides protection from excessive charge accumulation, such as the charge accumulations arising from electrostatic discharge (ESD) events. While the scope of the invention is limited only by the claims appended hereto, the invention to be described hereinafter is particularly effective in protecting devices 110 fabricated in accordance with a process which uses salicide (i.e., Self-Aligned siLICIDE).

Device 110 includes a plurality of interface pads $114_1$, $114_2$, ... $114_N$. It should be appreciated that interface pads $114_i$ may be an input pad of the device, an output pad of the device, or an Input/Output (I/O) pad of the device. In a preferred embodiment, pads $114_1$, $114_2$, ..., $114_N$ are input pads. Each one of pads $114_i$ may be connected to internal circuitry of device 110, shown in exemplary fashion as a device circuit 116 connected to pad $114_1$. Device circuit 116 may be, in one embodiment, an input buffer. Other internal circuitry may likewise be connected to pads $114_2$, ..., $114_N$ (although not shown in FIG. 5).

Device 110 may further include an electrostatic discharge (ESD) bus 118, designated $V_{ESD}$. Each pad $114_1$, $114_2$, ... $114_N$ may be connected to the ESD bus 118 by a respective one of a first plurality of diodes $D_1'$. Diodes $D_1'$ are configured for shunting charge from positive polarity ESD events occurring on one of the pads $114_1$, $114_2$, ... $114_N$ to $V_{ESD}$ bus 118. A plurality of second diodes $D_2$ are coupled between the negative power supply bus, designated $V_{ss}$, and a respective one of pads $114_1$, $114_2$. ..., $114_N$. As shown in FIG. 5, the orientation of diodes $D_2$ (i.e., anode connected to $V_{ss}$, and cathode connected to the pad $114_i$) is such that the voltage on a pad $114_i$ due a negative polarity ESD event is clamped to approximately one (1) diode drop of $V_{ss}$.

The positive power supply bus for the integrated circuit, designated $V_{DD}$, is protected against ESD with respect to the negative power supply bus, designated $V_{ss}$, and vice-versa, using a core clamp 120. Core clamp 120 is conventional in the art and will not be further addressed.

Figure 6:
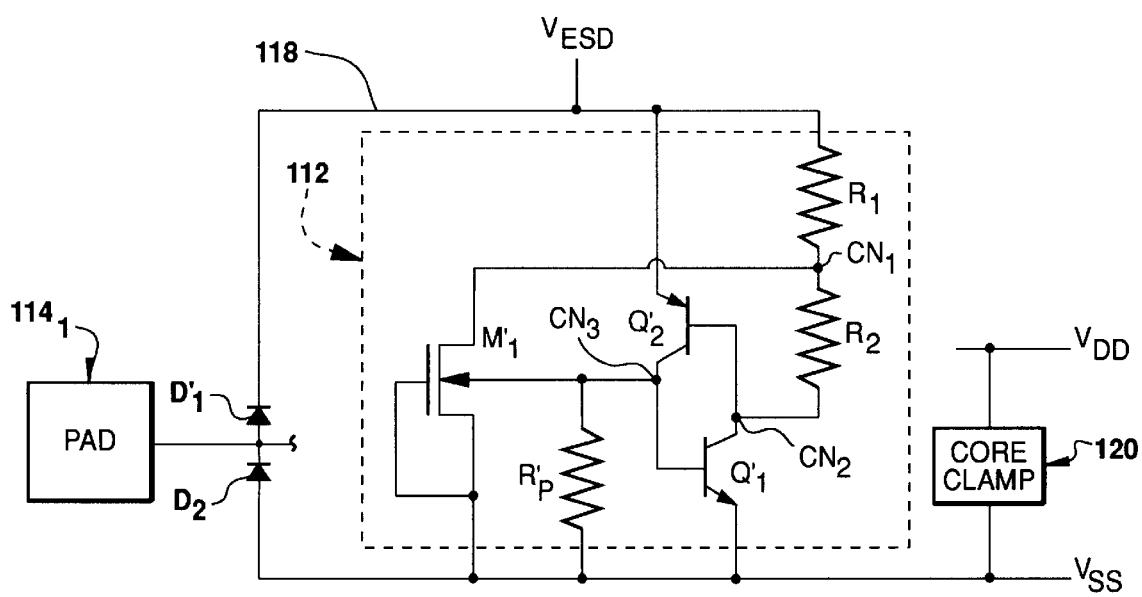
FIG. 6 is a simplified, equivalent circuit schematic and block diagram view showing, in greater detail, the preferred embodiment shown in block diagram form in FIG. 5.

FIG. 6 shows the inventive ESD protection means 112 in greater detail. As shown in the Figure, ESD protection means 112 may be, and is in the preferred embodiment, connected to ESD bus 118. However, it should be understood that the configurations in which the present invention may be used include, but are not limited to, use directly between a pair of power supply pads, between an interface pad (as defined above) and a power supply pad, or between an "ESD bus", such as ESD bus 118, and a power supply pad (such as $V_{ss}$). The $V_{ESD}$ bus 118 is preferably isolated from the positive power supply bus $V_{DD}$, thereby improving input leakage performance (i.e., no direct path to the power supply). Bus 118 may be formed in device 110 using a variety of conductive materials; preferably, however, a metal and/or metal alloy is used to form $V_{ESD}$ bus 118.

Protection means 112 is configured to isolate $V_{ESD}$ bus 118 from the negative power supply Vss when in a first state (e.g., a high-impedance "OFF" state) to thereby reduce externally-sourced leakage currents into pads $114_1$, $114_2$, ... $114_N$ (i.e., through a respective diode $D_1'$ to bus 118 then to ground). Protection means 112 is further configured for transferring charge from $V_{ESD}$ bus 118 to $V_{ss}$ when in a second state (e.g., a low impedance "ON" state). The protection means may further include a circuit or structure for transitioning from the first state to the second state when a voltage on $V_{ESD}$ bus 118 reaches a predetermined threshold level. The predetermined threshold level is preferably selected to be higher than $V_{DD}$, and, further, selected to be higher than the highest normal operating voltage expected to be encountered at pads $114_1$, $114_2$, .... $114_N$, (e.g., if $V_{DD}$=3.3 v, and it is expected that pins of the IC will encounter 5V, then the threshold level will be selected higher than 5V).

With continued reference to FIG. 6, ESD protection means 112 in a preferred embodiment include a pair of impedance elements such as a resistive voltage divider comprising resistive elements $R_1$ and $R_2$, an ESD protective trigger circuit (which may comprise a field effect transistor (FET) $M_1'$) coupling the node (i.e., node $CN_1$ in FIG. 6) between resistive elements $R_1$ and $R_2$ to a $V_{ss}$ bus, configured to trigger an SCR circuit into conduction in response to a voltage level on the $V_{ESD}$ bus, an SCR circuit 122, and a resistor, designated $R_p'$. The impedance elements may be any type of resistive and/or capacitive element adapted to cause a voltage drop when current flows therethrough (in a manner to be described in detail below). Preferably, they are primarily resistive in nature, as mentioned above.

SCR circuit 122 may be represented in FIG. 6 by an equivalent electrical circuit diagram including an NPN bipolar junction transistor $Q_1'$, and a PNP bipolar junction transistor $Q_2'$. $Q_1'$ and $Q_2'$ are interconnected so that each receives base current from the collector terminal of the other. When either transistor is turned-on, the conducting transistor supplies base current to the other. Thus, SCR circuit 122 latches up with both transistors turned-on after either of the transistors is initially turned-on. The two transistors turn off when current is interrupted in either transistor. SCR circuit 122 is connected between ESD bus 118, and bus $V_{ss}$.

Resistive elements $R_1$ and $R_2$ are connected at a first common node $CN_1$, and are in series relationship to each other. Series-connected combination $R_1$ and $R_2$ is connected between ESD bus 118, and a second node $CN_2$ associated with SCR circuit 122.

FET $M_1'$ comprises, in a preferred embodiment, an N-channel field effect transistor (FET), having a gate terminal, and a source terminal, both connected to bus $V_{ss}$. $M_1'$ further includes a drain terminal connected to node $CN_1$. The equivalent schematic representation of FET $M_1'$ includes a fourth, substrate terminal electrically coupled to a third common node $CN_3$. Node $CN_3$ is coupled through an equivalent resistance $R_p'$ to bus $V_{ss}$.

An enhanced understanding of the operation of protection means 112, as implemented in the preferred embodiment, may be had from a description of the corresponding semiconductor structure. Accordingly, reference is now made to FIG. 7, which shows a semiconductor structure corresponding to ESD protection means 112, in cross-sectional, simplified, and exaggerated form for purposes of illustration.

The semiconductor structure corresponding to ESD protection means 112 includes a substrate of a first conductivity type, such as P-type silicon substrate 124, a first ohmic contact of the first conductivity type, such as P$^+$ diffusion 126 formed in substrate 124, a drain region of a second conductivity type opposite the first conductivity type, such as N$^+$ diffusion region 128 formed in substrate 124, a source region of the second conductivity type, such as N$^+$ diffusion region 130 formed in substrate 124, a channel region 132 defined in the substrate between spaced apart drain 128 and source 130 regions, a well region of the second conductivity type, such as N-well 134 formed in substrate 124$_1$, a second ohmic contact region of the second conductivity type, such as N$^+$ diffusion region 136 formed in N-well 134, a third ohmic contact region of the second conductivity type, such as N$^+$ diffusion region 138 formed in N-well 134, a junction region of the first conductivity type, such as P$^+$ diffusion region 140 formed in N-well 134, a layer of dielectric material 142 overlying a portion of substrate 124, including a gate dielectric region overlying at least channel region 132, a conductive cladding 144 formed on various diffusion regions 126, 128, 130, 136, 138, and 140, and a transistor control gate 146 formed over dielectric 142.

Structures labeled FOX are field oxide regions. Dielectric layer 142 includes a gate dielectric region overlying channel 132. Control gate 146 includes a portion overlying channel region 132. In a preferred embodiment, p$^+$ first ohmic contact 126, control gate 146, and n$^+$ source region 130 are connected to the negative power supply bus V$_{ss}$. Also in the preferred embodiment, n$^+$ diffusion region 136, and p$^+$ diffusion 140 are connected to V$_{ESD}$ bus 118. N$^+$ drain region 128 is connected to third ohmic contact 138.

Figure 7:
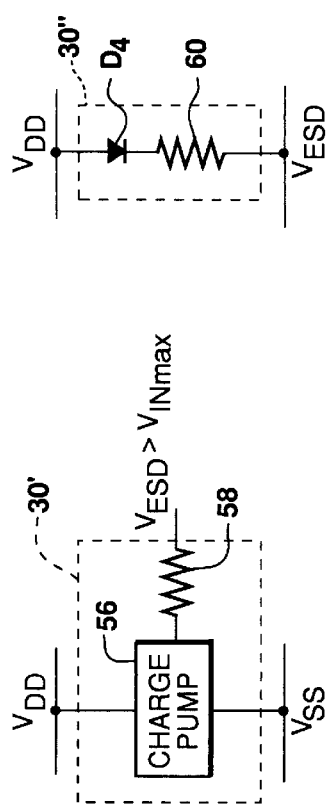
FIG. 7 is a simplified, exaggerated cross-sectional view of a semiconductor structure corresponding to the protection means shown in FIG. 6.

It should be understood that the structure shown in FIG. 7 is diagrammatic and exaggerated for ease of illustration. It should be further understood that variations in donor/acceptor impurities, and concentrations of same to fabricate the structure shown in FIG. 7, as set forth hereinafter, are many in number and are limited only by the skill of those in the art.

The P type substrate 124 is typically relatively lightly doped and thus has a relatively low degree of conductivity. Specifically, the doping level of substrate 124 may be $\leq 10^{19}$ cm$^{-3}$, preferably range between about $10^{13}$ to $10^{17}$ cm$^{-3}$, more preferably between about $10^{14}$ to $10^{16}$ cm$^{-3}$, and is about $2.5 \times 10^{14}$ cm$^{-3}$ in a most preferred embodiment. The foregoing assumes a homogeneous type substrate. Alternatively, an epitaxial type substrate may be used. The epitaxial type substrate may be formed using a heavily P+ doped wafer (e.g., having a resistivity between about 0.01–0.02 ohm*cm), having an epitaxial layer (e.g., 3–5 microns thick) on top. The epitaxial layer may have the same doping levels as the homogeneous type substrate. The P$^+$ regions 126, and 140 are relatively heavily doped and are therefore of relatively high conductivity. Specifically, the doping level of regions 126 and 140 may be between about $10^{19}$ to $10^{21}$ cm$^{-3}$, more preferably between $10^{20}$ and $10^{21}$ cm$^{-3}$, and is about $1.0 \times 10^{20}$ cm$^{-3}$ in a most preferred embodiment.

The N$^+$ conductivity type regions 128, 130, 136, and 138 are relatively heavily doped and therefore have relatively high conductivity. The N$^+$ regions may have a doping level of about $10^{19}$ to $10^{21}$ cm$^{-3}$, preferably between about $10^{20}$ and $10^{21}$ cm$^{-3}$, and about $1.0 \times 10^{20}$ cm$^{-3}$ in a most preferred embodiment.

The N-well 134 is relatively lightly doped, and therefore has a relatively low degree of conductivity. N-well 134 may have a doping level between about $10^{16}$ and $5 \times 10^{18}$ cm$^{-3}$, preferably between about $5.0 \times 10^{16}$ and $10^{18}$ cm$^{-3}$, and may be about $2.0 \times 10^{17}$ cm$^{-3}$ in the preferred embodiment. Preferably, the doping level of N-well 134 is less than that of N+ regions 128, 130, 136 and 138.

Dielectric material 142, as well as the field oxide regions, may be silicon dioxide material. The gate dielectric region overlying channel 132 may have a thickness in a range of about 135–155 Å, and is preferably about 145 Å thick.

Diffusion cladding material 144 may comprise TiSi$_2$ silicide (preferably WSi$_x$ or other metal) having a thickness in the range of about 20 Å to 2000 Å, preferably from 100 Å to 1000 Å, and is most preferably about 700 Å thick. The cladding may be formed on the diffusion regions using self-aligned silicide, namely, salicide.

Transistor control gate 146 may comprise polycrystalline silicon ("POLY") material having a thickness in the range of about 2250–2750 Å, and is preferably about 2500 Å thick.

Referring now to FIGS. 6 and 7, NMOS FET M$_1$' is formed by way of n$^+$ drain region 128, channel region 132, n$^+$ source region 130, gate oxide 142, and transistor control gate 146. NPN bipolar transistor Q$_1$' is formed by n$^+$ source region 130 (emitter), P-substrate 124 (base), and N-well 134 (collector). PNP bipolar transistor Q$_2$' is formed by P$^+$ diffusion 140 (emitter), N-well 134 (base), and P-substrate 134 (collector). Resistive element R$_p$' is formed by the electrically conductive material from P-substrate 124 to P-type ohmic contact 126, which is in turn coupled to the negative power supply bus V$_{ss}$. Resistive, series-connective elements R$_1$, and R$_2$ are formed by the conductive material of N-well 134. An intermediate node, namely, first common node CN$_1$ (FIG. 6), is formed by n$^+$ ohmic contact region 138 between PNP emitter terminal 140, and n$^+$ diffusion 136.

With continued reference to FIGS. 6 and 7, a description of the operation of the inventive protection means 112, as used in semiconductor device 110, will now be set forth in detail.

When a device, such as semiconductor device 110 employing the embodiment of FIG. 6 is powered-up, the node to be protected, namely, V$_{ESD}$ bus 118 in the preferred embodiment, is essentially at 0 volts. Protection means 112, particularly SCR circuit 122, is initially in a first, high-impedance "OFF" state. In the first state, any voltage that is applied to input pads 114$_1$, 114$_2$. . . , 114$_n$, that is, in excess of V$_{DD}$ (but below the threshold trigger level), will not cause large leakage currents to be drawn. Rather, such initial voltages will at most cause relatively small, transient currents to flow through diode D$_1$' to charge V$_{ESD}$ bus 118 to a voltage level one diode drop below the excessive voltage being applied. Subsequent applications of voltages higher than V$_{DD}$ (e.g., 5.0 volts when V$_{DD}$=3.3 volts) will cause substantially no further input leakage currents to flow. Controlled application of voltages, even in excess of V$_{DD}$, to pins of the device in this context may be considered "normal". However, ESD events are not considered part of the "normal" operation of the device.

For a subsequent positive polarity ESD event on one or more of the pads 114$_1$, 114$_2$, . . . 114$_N$, respective diodes D$_1$' become forward biased and shunt the charge from the corresponding pad $114_1, 114_2, \ldots 114_N$, to the $V_{ESD}$ bus 118. As charge is transferred onto $V_{ESD}$ bus 118, voltage on the bus 118 increases with respect to $V_{ss}$. For voltages below the NMOS drain-to-substrate breakdown voltage (i.e., the junction formed by N$^+$ drain region 128, and P-substrate 124), the voltage on the NMOS drain terminal (diffusion 128) is approximately equal to that on ESD bus 118 voltage. This approximation is fairly accurate since the current level being drawn from the $V_{ESD}$ bus 118 is fairly low (and thus a fairly low voltage drop across $R_1$ and $R_2$).

When the voltage on ESD bus 118 reaches the NMOS drain breakdown voltage, current begins to flow through N-well 134 between N$^+$ diffusion 136, and N+diffusion 138 as drain junction 128 breaks down, and injects holes into substrate 124. The hole injection into substrate 124 from drain region 128 forward biases the NMOS n$^+$ source 130. The forward-biased source 130 injects electrons, which are collected by both n$^+$ drain 128, and the adjacent N-well 134. Simultaneous with the NMOS drain 128 breakdown, the current flowing between the two n$^+$ "taps" in N-well 134 (i.e., n$^+$ contact 136, and n$^+$ contact 138) results in a voltage drop across the n-well 134, which causes the P$^+$ diffusion 140 to become forward biased. Forward bias of p$^+$ 140 results in an injection of holes into substrate 124. The injection of holes from the P$^+$ diffusion region hastens the transition of SCR 122 into a latched state.

Inasmuch as the injection of holes from the P$^+$ diffusion 140 is initiated as soon as the breakdown of drain 128 occurs (i.e., when current begins to flow through the resistive elements $R_1$ and $R_2$), the time lag between the occurrence of an ESD event, and when the SCR turns on becomes sufficiently short to effectively handle relatively fast ESD events, such as ESD events occurring according to the Charged Device Model (CDM). Contrast this SCR turn-on mechanism with the turn-on sequence of the same structure without n+ contact 138 (such as disclosed and claimed in copending U.S. Ser. No. 08/515,433 entitled APPARATUS FOR ESD PROTECTION). In that structure, turn-on occurs after electrons from the forward biased source 130 diffuse into n-well, which occurs later.

The low-impedance "ON" state of SCR 122 is characterized by a voltage drop of approximately 1.4 volts between ESD bus 118, and the negative power supply bus $V_{ss}$. The SCR circuit 122 will remain in the low-impedance state until current through either transistor $Q_1'$ or $Q_2'$ is interrupted. This interruption may occur when all of the charge from the ESD event is transferred from the node to be protected (e.g., the $V_{ESD}$ bus 118 in the preferred embodiment) to a "sink" node (e.g., in the preferred embodiment, the $V_{ss}$ bus). Once the charge transfer is complete, protection means 112, particularly SCR 122, returns to a high-impedance "OFF" state. Positive ESD events, referenced to the positive power supply bus $V_{DD}$, can be transferred from the $V_{ss}$ bus to the $V_{DD}$ bus through core clamp 120.

In view of the foregoing, it should be appreciated that irrespective of the voltage of the positive power supply bus $V_{DD}$, the voltage on the input pad $114_i$ may be allowed to go as high as the NMOS drain junction breakdown voltage, plus one diode drop (i.e., for $D_1'$ ), with very small leakage currents. Based on the foregoing fabrication details for the constructed embodiment, a maximum allowed voltage on the input pad may be approximately 13.0 volts. At this threshold level, the above-described breakdown occurs, thus triggering the SCR circuit 122 into conduction. Of course, ESD events will likely be higher than this level, thus triggering protection means 112 into the low impedance, protection state. However, for a variety of applications, other than ESD events, where input voltages on the input pad exceed the positive power supply operating voltage $V_{DD}$ (but lower than the breakdown threshold level), very low leakage levels can be obtained.

The foregoing describes one embodiment of the present invention. However, further embodiments of the present invention may in accordance with the teachings described herein are within the spirit and scope of the present invention.

An apparatus for protecting a semiconductor device, in accordance with the present invention, permits effective dissipation of ESD events under a variety of fabrication processes, while providing for extremely low input leakage currents for input voltages that are above the operating voltage of the chip, but are within "normal" expected ranges. An example of a "normal" over-voltage may be the voltage seen in a mixed-voltage environment (e.g., $V_{DD}$=3.3 volts while input voltages=5.0 volts). The improved turn-on time of the SCR portion of protection means 112 permits a semiconductor device employing such protection circuitry to meet state-of-the-art standards, including safely handling ESD events according to the Human Body Model, as well as the Charged Device Model.

It should be understood that the embodiment of FIGS. 5–7 may also be used with either or both of the minimum $V_{ESD}$ voltage limiting means 30, and maximum $V_{ESD}$ voltage limiting means 32, (and the particular implementations of same illustrated in FIGS. 3A–3C and 4) when protection means 112 is used with an ESD bus, such as bus 118.

While the invention has been particularly shown and described with reference to the preferred embodiments thereof, it is well understood by those skilled in the art that various changes and modifications can be made in the invention without departing from the spirit and scope of the invention.

I claim:

1. An apparatus for protecting a semiconductor device from excessive charge, the device including an interface pad selected from the group including an input pad, an output pad, and an input/output pad, comprising:

an SCR circuit configured to transfer charge from an electrostatic discharge (ESD) bus to a negative bus of a power supply;

a field effect transistor (FET) coupled to said SCR circuit;

a first impedance element connected between the ESD bus and a common node;

a second impedance element connected between the common node and said SCR circuit; and a first diode for coupling said interface pad to said ESD bus, said first diode having an anode and a cathode, wherein said interface pad is connected to said anode;

said FET being further coupled to said common node and configured to activate transfer of charge by said SCR circuit when a voltage on the ESD bus reaches a predetermined threshold level.

2. The apparatus of claim 1 wherein said first impedance element and said second impedance element comprise semiconductor material.

3. The apparatus of claim 2 wherein said semiconductor material comprises n-type conductivity semiconductor material which forms an N-well structure in said apparatus.

4. The apparatus of claim 1 wherein the device further includes at least one further interface pad which is coupled through a further first diode to said ESD bus.

5. The apparatus of claim 1 further including a second diode disposed between said negative power supply bus (Vss) and said interface pad for transferring negative ESD charge.

6. The apparatus of claim 1 wherein said first impedance element includes a first resistive element and said second impedance element includes a second resistive element connected in series with said first resistive element at a common node, and wherein said FET includes a drain terminal, a source terminal, and a gate terminal, said source terminal and said gate terminal being connected to said negative bus, said drain terminal being connected to said common node.

7. The apparatus of claim 1 further comprising a circuit for maintaining a voltage of said ESD bus at a predetermined minimum level.

8. The apparatus of claim 7 further comprising a circuit for limiting a voltage on said ESD bus to a maximum predetermined level.

9. The apparatus of claim 8, wherein said circuit for limiting a maximum voltage of said ESD bus comprises a diode and a resistor coupled in series between ESD bus and a positive bus of said power supply.

10. The apparatus of claim 7, wherein said circuit for maintaining said voltage on the ESD bus comprises a charge pump coupled to (i) said negative bus of said power supply and (ii) a positive bus of said power supply.

11. The apparatus of claim 7, wherein said circuit for maintaining said voltage on ESD bus comprises a diode and a resistor coupled in series between a positive bus of said power supply and said ESD bus.

12. The apparatus of claim 1 further comprising a circuit for limiting a voltage on said ESD bus to a maximum predetermined level.

13. The apparatus of claim 12, where in said circuit for limiting a maximum voltage of said ESD bus comprises a diode and a resistor coupled in series between ESD bus and a positive bus of said power supply.

14. The apparatus of claim 13, wherein said resistor is directly coupled to said ESD bus, and said diode is coupled between said resistor and said positive bus of said power supply.

15. The apparatus of claim 1, wherein said SCR circuit comprises (i) a first transistor coupled to said ESD bus and (ii) a second transistor coupled to said negative bus of said power supply, at least one of said first and second transistors being coupled to said second impedance element.

16. The apparatus of claim 15, wherein said first and second transistors each comprise a bipolar transistor.

17. The apparatus of claim 16, wherein each of said first and second transistors have a base receiving current from a collector of the other of said first and second transistors.

18. The apparatus of claim 17, wherein said second impedance element is directly coupled to (i) said base of said first transistor and (ii) said collector of said second transistor.

19. A device for electrostatic discharge (ESD) protection comprising:

a silicon controlled rectifier (SCR) device configured to transfer charge from a first node to a second node;

a trigger device configured to activate transfer of charge by said SCR device when a voltage on the first node reaches a predetermined threshold level;

said SCR device including,
  (i) a substrate of a first conductivity type; and,
  (ii) a well region of a second conductivity type opposite said first conductivity type formed in said substrate, said well region including a first ohmic contact region of said second conductivity type formed in said well, a second ohmic contact region of said second conductivity type formed in said well region spaced from said first ohmic contact region, and a junction region of said first conductivity type formed in said well;

a third ohmic contact region of said first conductivity type formed in said substrate;

a drain region of said second conductivity type opposite said first conductivity type formed in said substrate, a source region of said second conductivity type formed in said substrate, said source and drain regions being spaced apart to define a channel region therebetween;

a gate dielectric region of dielectric material overlying said channel region;

a control gate formed over said gate dielectric region;

said third ohmic contact, said control gate, and said source region being connected to a negative power supply bus (Vss);

an ESD bus connected to said junction region and said first ohmic contact region;

said drain region being connected to said second ohmic contact region wherein a resistive element formed by a portion of said well region is electrically interposed between said ESD bus and said drain region; and a first diode having an anode coupled to one of the interface pads and a cathode coupled to said ESD bus.

20. The structure of claim 19 further including a second diode having an anode coupled to said negative power supply bus ($V_{ss}$) and a cathode coupled to said one input pad.

21. The structure of claim 20 wherein said first conductivity type is p-type and said second conductivity type is n-type.

* * * * *